United States Patent [19]

Turner, Jr.

[11] 4,413,228

[45] Nov. 1, 1983

[54] ELECTRICAL HARNESS ANALYZER

[75] Inventor: Hilton A. Turner, Jr., Rolla, Mo.

[73] Assignee: General Motors Corporation, Detroit, Mich.

[21] Appl. No.: 305,472

[22] Filed: Sep. 25, 1981

[51] Int. Cl.³ .............................................. G01R 31/02
[52] U.S. Cl. ...................................... 324/51; 340/651; 340/652
[58] Field of Search .................. 324/51; 340/647, 650, 340/651, 652

[56]  References Cited

U.S. PATENT DOCUMENTS

| | | | |
|---|---|---|---|
| 3,284,707 | 11/1966 | Clinton | 324/51 X |
| 3,412,392 | 11/1968 | Jenkins et al. | 324/51 X |
| 3,551,796 | 12/1970 | Holder et al. | 324/51 |
| 3,872,384 | 3/1975 | Laass | 324/51 |
| 4,233,560 | 11/1980 | Bleuman | 324/51 X |
| 4,236,146 | 11/1980 | Clark et al. | 340/652 X |

FOREIGN PATENT DOCUMENTS 627497   8/1978   U.S.S.R. ............................. 340/650

OTHER PUBLICATIONS

Balchunas, Audible Test Set for Detecting Opens and Mixed Gauges in, and Incorrect Lengths of Cable Conductors, Western Elec. Technical Digest No. 33, Jan. 1974, pp. 7, 8.

Primary Examiner—Stanley T. Krawczewicz
Attorney, Agent, or Firm—Warren D. Hill

[57] ABSTRACT

To inspect a radio speaker harness, two analyzer circuits are connected to the harness in sequence by a switching arrangement. Each analyzer circuit comprises a pair of opposite conductivity type transistors with their bases connected through the switching arrangement to one end of the harness. An indicator lamp in series with each transistor reveals its conductivity state. One transistor is biased to conduct when the harness-to-ground resistance is above a certain value and the other transistor is biased to conduct when that resistance is below another value higher than the first so that the energization of the indicator lamps indicates the integrity of the harness. One analyzer circuit is connected by the switching means to one end of the harness while the other end is open to check the harness for short to ground and a predetermined electrical resistance to ground. The other analyzer circuit is connected to an end of the harness by a switch while the other end is grounded for checking the continuity of the harness and speaker arrangement.

2 Claims, 1 Drawing Figure

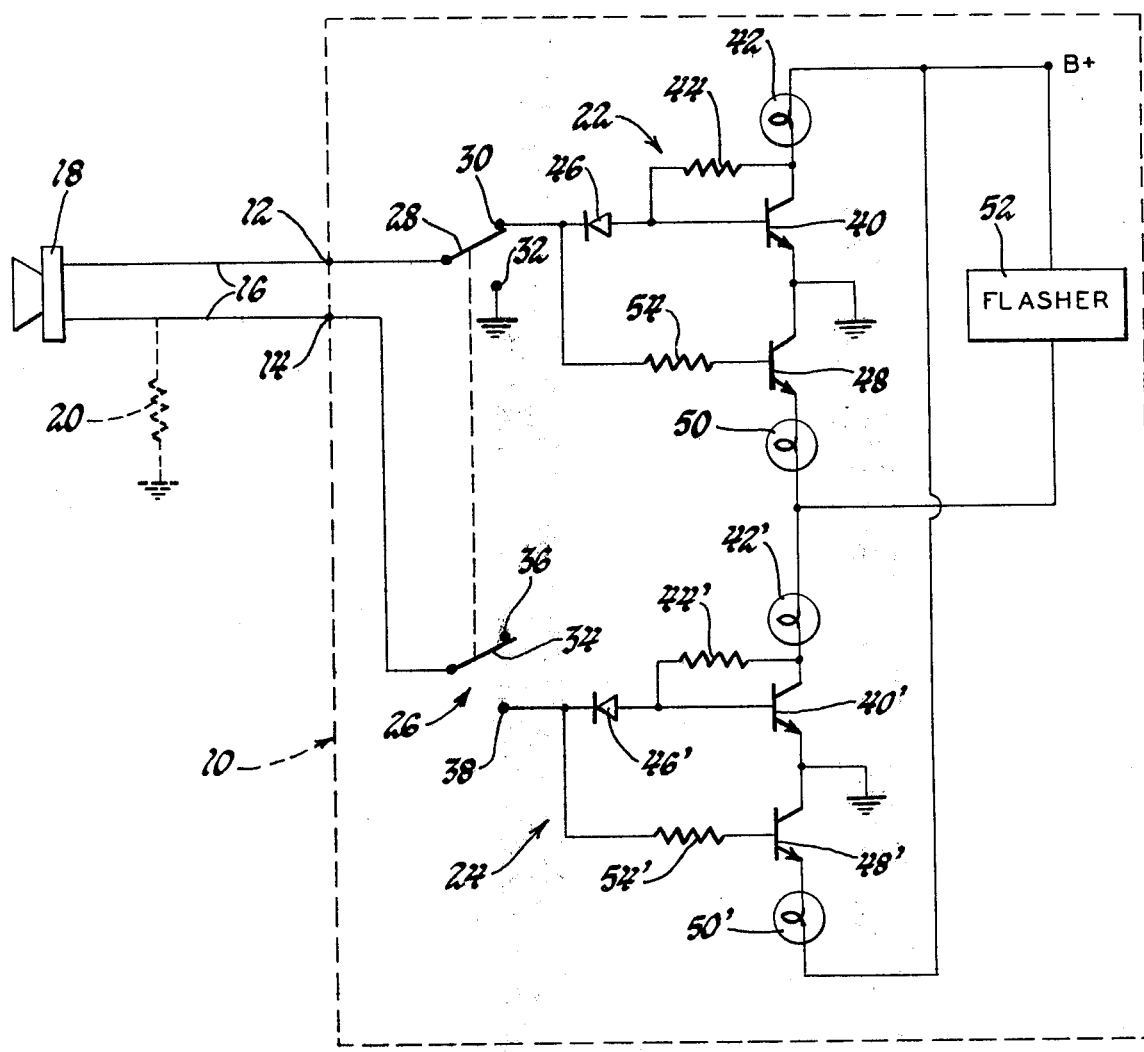

ELECTRICAL HARNESS ANALYZER

This invention relates to a harness analyzer and more particularly to an analyzer circuit for checking the condition of an electrical harness.

It is desirable to be able to check the integrity of electrical harnesses of automotive vehicles after assembly of the vehicle for troubleshooting problems as they arise or for routinely monitoring harness installations for quality control purposes. For example, it is required that the radio speaker of a vehicle and its associated harness be isolated from ground. Even high resistance faults are not allowable and, of course, it is necessary that there be continuity in the harness and speaker assembly.

It is therefore an object of this invention to provide a harness analyzer for quickly and accurately detecting faults in a vehicle harness.

The invention is carried out by providing an analyzer circuit having a pair of transistors each coupled to an indicator for showing the conduction state of the respective transistor and biasing circuitry for turning on the respective transistors in accordance with the harness-to-ground resistance of the harness under test. The invention further contemplates a pair of such analyzer circuits sequentially coupled to the harness by a switching arrangement for performing multiple tests on the harness.

The above and other advantages will be made more apparent from the following specification taken in conjunction with the accompanying drawing wherein:

The drawing is a schematic circuit of a harness analyzer according to the invention.

The drawing shows a harness analyzer 10 having input terminals 12 and 14 connected to the ends of a harness 16 of a radio speaker 18. An electrical resistance 20 shown in dotted lines represents a harness-to-ground fault which may occur and which the harness analyzer is intended to detect. The resistance 20 may take the form of a short to ground which is considered to be any resistance less than 150 ohms or it may be a high resistance fault up to 35K ohms harness-to-ground resistance. The harness analyzer is designed to detect both of these problems and separately identify them. The harness analyzer also checks continuity of the harness and speaker assembly 16, 18.

The harness analyzer 10 includes a first analyzer circuit 22, a second analyzer circuit 24 and a switch 26 for sequentially coupling the first and second analyzer circuit to the terminals 12 and 14. The switch 26 includes a movable pole 28 movable between stationary contacts 30 and 32. Contact 30 is connected to the first analyzer circuit 22 and the contact 32 is connected to ground. The second pole 34 of the switch moves in unison with the pole 28 and moves between stationary contacts 36 and 38. Contact 36 is open circuited while the contact 38 is connected to the second analyzer circuit 24.

The first analyzer circuit 22 includes an NPN transistor 40 having a grounded emitter and its collector is connected through an indicator lamp 42 to a voltage source B+. The collector is connected to the transistor base through a biasing resistor 44. The transistor base is connected through an isolation diode 46 to the contact 30. The diode 46 is poled to prevent current flow toward the transistor and the voltage drop across the diode is insufficient to bias the transistor into conduction. The resistor 44 is preferably 10K ohm. The series combination of the resistor 44, the diode 46 and resistance 20 comprises a voltage divider which establishes the voltage on the transistor base. When the resistance 20 is less than 150 ohms, the base voltage is too low to sustain transistor conduction. When the resistance 20 is more than 150 ohms, the transistor 40 is biased on. Consequently, in the absence of a harness-to-ground short the lamp 42 will be illuminated. The first analyzer circuit 22 also includes a PNP transistor 48 having a grounded collector and its emitter is connected serially through an indicator lamp 50 and through a flasher 52 to the voltage source B+ so that intermittent voltage is applied to the transistor 48. The transistor base is connected through a 1K ohm resistor 54 to the contact 30. The transistor 48 is biased so that if the harness-to-ground resistance is less than 35K ohms, the transistor will conduct to illuminate the lamp 50 to cause a flashing indication of a harness fault. In the event the harness-to-ground resistance 20 is above 150 ohms and below 35K ohms, both lamps 42 and 50 will be illuminated to give a unique indication of that condition. For a short condition, that is, the resistance 20 is less than 150 ohms, only flashing lamp 50 will be illuminated whereas for a harness showing no fault, only the lamp 42 will be illuminated. Preferably the lamp 42 is green and the lamp 50 is red. Thus, the harness analyzer 10 with the switch 26 in the position shown in the drawing utilizes only the first analyzer circuit 22 and performs the tests for a short to ground and a high resistance fault.

The second analyzer circuit 24 is essentially the same as the first analyzer circuit 22 and primed reference numerals 40' through 54' are utilized to indicate the components corresponding to the components 40 through 54 in the first analyzer circuit. There are only two differences. First, the voltage B+ is connected to the lamp 50' and the flasher 52 is connected to the lamp 42' and second, the indicator lamps 42' and 50' are preferably red and green respectively. With the switch 26 in the state opposite to that shown in the drawings, the harness will have one end connected to ground through the contact 32 and the other end connected to the second analyzer circuit 34 through the contact 38. If the harness and speaker combination have good continuity, the transistor 48' will conduct to steadily illuminate the lamp 50' while the transistor 40' and the lamp 42' will be turned off. If, on the other hand, there is a lack of continuity indicating a harness fault, the transistor 40' will conduct intermittently to allow the lamp 42' to flash while the lamp 50' will be turned off. Thus, the same analyzer circuit configuration is useful for checking both shorts and continuity.

In the event an installation contains several harnesses to be tested simultaneously as is the case, for example, where there are four radio speakers in a vehicle, the analyzer 10 is expanded to include additional analyzer circuits like those described for simultaneously monitoring the additional harnesses.

It will thus be seen that the harness analyzer according to this invention is a simple and inexpensive instrument for the accurate detection of vehicle harness faults.

The embodiments of the invention in which an exclusive property or privilege is claimed are defined as follows:

1. A harness analyzer circuit for testing an electrical harness for electrical resistance to ground and a short to ground comprising;

first and second indicators, a first transistor of a first conductivity type having its emitter and collector serially connected with the first indicator between a voltage source and ground, a resistor connected between the collector and the base, and having its base adapted to be connected to one end of the harness under test, said resistor and the harness-to-ground circuit forming at least a part of voltage divider means connected to the base of said transistor whereby a base bias is developed such that if the harness is not connected to ground the transistor conducts to energize the first indicator and if the harness-to-ground resistance is less than a first value the transistor and the first indicator are turned off, and a second transistor of conductivity type opposite that of the first transistor having its emitter and collector serially connected with the second indicator between the voltage source and ground and having its base adapted to be connected to the said one end of the harness, whereby a base bias is developed such that if the harness is not connected to ground the second transistor and second indicator are turned off, and if the harness-to-ground resistance is less than a second value which is higher than the first value the second transistor conducts to energize the second indicator, and if the harness-to-ground resistance is between the first and second values both transistors conduct to energize both indicators.

2. A harness analyzer for testing an electrical harness for continuity, electrical resistance to ground and short to ground comprising first and second analyzer circuits, each analyzer circuit comprising first and second transistors of opposite conductivity types, the first said transistor having its emitter and collector connected between a voltage source and ground, a resistor connected between the collector and the base, the base adapted to be connected to the harness under test whereby the first transistor is biased to conduct only when the harness-to-ground resistance is above a first value, the second transistor having its emitter and collector connected between the voltage source and ground and its base adapted for connection to the harness under test whereby the second transistor is biased to conduct only when the harness-to-ground resistance is less than a second value, and indicator means connected with each transistor and responsive to transistor current flow for indicating transistor conduction, and switch means connected to the first and second analyzer circuits and adapted for connection to the harness under test, the switch means having one state for connecting the first analyzer circuit to an end of the harness, the other end of the harness remaining unconnected, for testing the harness for shorts and harness-to-ground resistance below the second value, the switch means having another state for connecting the second analyzer circuit to an end of the harness and for connecting the other end of the harness to ground for testing the continuity of the harness, whereby the harness condition is revealed by the indicator means.

* * * * *